(12) United States Patent
Kim et al.

(10) Patent No.: US 6,473,344 B2
(45) Date of Patent: Oct. 29, 2002

(54) SEMICONDUCTOR MEMORY DEVICE CAPABLE OF OUTPUTTING A WORDLINE VOLTAGE VIA AN EXTERNAL PIN

(75) Inventors: Hyung-Gon Kim; Yeong-Taek Lee, both of Seoul (KR)

(73) Assignee: Samsung Electronics Co., Ltd., Hwasung (KR)

( * ) Notice: Subject to any disclaimer, the term of this patent is extended or adjusted under 35 U.S.C. 154(b) by 0 days.

(21) Appl. No.: 09/952,515

(22) Filed: Sep. 13, 2001

(65) Prior Publication Data

US 2002/0085429 A1 Jul. 4, 2002

(30) Foreign Application Priority Data

Jan. 3, 2001 (KR) .............................................. 01-00212

(51) Int. Cl.[7] .............................................. G11C 16/04
(52) U.S. Cl. ........................... 365/189.09; 365/185.23; 365/189.06; 365/201; 365/185.03
(58) Field of Search ....................... 365/185.23, 189.06, 365/201, 185.03, 185.09

(56) References Cited

U.S. PATENT DOCUMENTS

| | | | | |
|---|---|---|---|---|
| 6,075,738 A | * | 6/2000 | Takano | 365/189.01 |
| 6,285,594 B1 | * | 9/2001 | Bill et al. | 365/185.22 |
| 6,324,108 B1 | * | 11/2001 | Bill et al. | 365/185.09 |

* cited by examiner

Primary Examiner—Michael S. Lebentritt
Assistant Examiner—Toan Le
(74) Attorney, Agent, or Firm—Marger Johnson & McCollom, P.C.

(57) ABSTRACT

A semiconductor memory device includes a select signal generator, a wordline voltage generator, and a switch circuit. During a test operation mode, the device determine whether a wordline voltage has required level. The select signal generator activates one of select signals each corresponding to the other wordline voltages responsive to external select code signals. The external select code signals appoint an external instruction signal representative and appoint other wordline voltages used in the memory device. The wordline voltage generator generates a wordline voltage corresponding to the activated select signal out. The switch circuit transfers the wordline voltage outputted from the wordline voltage generator to a pad connected to an external pin.

17 Claims, 11 Drawing Sheets

| Fig. 3A | Fig. 3B |

Fig. 4

| VSRD | FVRSD[0] | FVRSD[0] | FVRSD[0] | VSRD | PROGRAM | PHASE[0] | PHASE[1] | PHASE[2] | Activated Signal | W/L Voltage |
|---|---|---|---|---|---|---|---|---|---|---|
| H | L | L | L | - | - | - | - | - | SWL[0] | Vread1 |
| H | H | L | L | - | - | - | - | - | SWL[1] | Vread2 |
| H | L | H | L | - | - | - | - | - | SWL[2] | Vread3 |
| H | H | H | L | - | - | - | - | - | SWL[3] | Vvfy1 |
| H | L | L | H | - | - | - | - | - | SWL[4] | Vvfy2 |
| H | H | L | H | - | - | - | - | - | SWL[5] | Vvfy3 |
| L | - | - | - | H | L | H | L | L | SWL[0] | Vread3 |
| L | - | - | - | H | L | L | H | L | SWL[1] | Vread2 |
| L | - | - | - | H | L | L | L | H | SWL[2] | Vread1 |
| L | - | - | - | L | H | H | L | L | SWL[3] | Vvfy1 |
| L | - | - | - | L | H | L | H | L | SWL[4] | Vvfy2 |
| L | - | - | - | L | H | L | L | H | SWL[5] | Vvfy3 |

- : Don't Care

SEMICONDUCTOR MEMORY DEVICE CAPABLE OF OUTPUTTING A WORDLINE VOLTAGE VIA AN EXTERNAL PIN

This application claims priority from Korean Patent Application No. 2001-212, filed on Jan. 3, 2001, the contents of which are herein incorporated by reference in their entirety.

FIELD OF THE INVENTION

The present invention relates to a semiconductor memory device and, more particularly, to a semiconductor memory device capable of providing wordline voltages used in an external memory device to storing multi-bit data.

BACKGROUND OF THE INVENTION

To substitute conventional hard disks with flash electrically erasable and programmable read only memories (EEPROMs), very high density and fast programming speeds are required. Flash memory EEPROMs and hard disks are included as mass storage facilities of various electronics products such as digital cameras, personal digital assistants, and other portable computing devices. As EEPROMs are used more frequently as mass storage facilities, the per bit price of EEPROMs drops. Multi-level cells are used to increase in density of the EEPROMs.

A technology for reducing the price of a memory per bit is disclosed in U.S. Pat. No. 6,067,248 entitled NONVOLATILE SEMICONDUCTOR MEMORY DEVICE WITH SINGLE-BIT AND MULTI-BIT MODES OF OPERATION AND METHOD FOR PERFORMING PROGRAMMING AND READING OPERATIONS THEREIN to Tae-Hwa Yoo.

The nonvolatile semiconductor memory device described in the Yoo patent includes multi-level or multi-bit memory cells. Programmed voltages of the respective memory cells are threshold voltages that can represent 2-bits of information. For example, "00", "01", "10", and "11" correspond to programmed threshold voltages 2.5V, 1.5V, 0.5V, and −3V, respectively. Put differently, the programmed cell has one of the four threshold voltages.

The process of detecting a data state for a multi-bit memory cell will be described with reference to FIG. 10. Different level read voltages e.g., Vread1, Vread2, and Vread3, between two threshold voltages are sequentially applied to each gate of memory cells via a wordline connected to a memory cell. Whether a current flows via the memory cell determines the data state of the cell. To detect 2-bit data stored in the memory cell, the determining operation or a read operation is carried out continuously three times during a predetermined sense interval.

To check whether a programmed memory cell has a required data state, a program verify operation is carried out. The verify operation is identical to the read operation except that the voltage levels of the verify voltages Vvfy1, Vvfy2, and Vvfy3 are different from those of the read voltages Vread1, Vread2, and Vread3. In this case, the Vvfy1, Vvfy2, and Vvfy3 are sequentially applied to each gate of the memory cells via a wordline. The verify voltages Vvfy1, Vvfy2, and Vvfy3 are greater than the Vread1, Vread2, and Vread3 by a voltage value corresponding to, for example, a half of a margin between adjacent threshold voltages.

As explained above, in order to read out data stored in a memory cell, a multi-bit nonvolatile semiconductor memory device requires six wordline voltages whose voltage levels are different from each other. To correctly read out the data stored in the memory cell, wordline voltages must be in accord with target values in design. Accordingly, a device capable of measuring and testing wordline voltages whose voltage levels are different from each other, is required.

One way of measuring wordline voltages utilizes a probe device. However, the probe device is not efficient and has difficulty correctly measuring target values because AC voltages are quickly applied to a wordlines during read and verify operations.

Accordingly, a need remains for a nonvolatile semiconductor memory device that directly and accurately measures wordline voltages.

SUMMARY OF THE INVENTION

According to one embodiment of the present invention, a semiconductor memory device includes a memory cell array having a plurality of wordlines, a plurality of bitlines, a plurality of memory cells located at intersections of the wordlines and the bitlines. The memory device includes a row selector, a select signal generator, a wordline voltage generator, and a switch circuit. The row selector is coupled to the wordlines. The row selector selects one of the wordlines and supplies a wordline voltage to the selected wordline. During a test operation mode, the select signal generator activates one of the select signals corresponding to the other wordline voltages responsive to an external instruction and external select code signals. The wordline voltage generator generates a wordline voltage corresponding to the activated one of the other wordline voltages. The switch circuit transfers the wordline voltage to a pad responsive to the external instruction signal.

Each of the memory cells stores multi-bit data and has one of a plurality of threshold voltages. The semiconductor memory device further includes a controller for generating an operation interval enable signal representing each operation interval of the test, normal read, and normal verify operation modes. The voltage generator is activated by the operation interval enable signal.

When performing the normal read/verify operations, the controller sequentially generates interval signals for appointing sense intervals for the normal read/verify operations. The select signal generator sequentially activates select signals, each select signal corresponding to sense intervals of the respective read and verify operations responsive to the interval signals. The select signals generated in the read and verify operations correspond to the other wordline voltages. The voltage generator generates a wordline voltage responsive to the activated select signal. Each of the memory cells includes an EEPROM cell. If the semiconductor memory device is packed, the pad is coupled to one of external pins of the packed memory device.

According to another embodiment of the invention, a method of measuring wordline voltages that are applied to a semiconductor memory device is provided. The memory device includes a memory cell array having a plurality of wordlines, a plurality of bitlines, and a plurality of memory cells located at intersections of the wordlines and the bitlines. A row selector selects one of the wordlines and supplies a wordline voltage to the selected wordlines. A wordline voltage generator generates other wordline voltages to be applied to the selected wordline. An external instruction signal is provided to inform a test operation mode. A determination is made of whether the wordline voltage has a required level. An external select code signal is then provided to appoint one of the other wordline voltages. During the test operation mode, one of the select signals is activated responsive to the external select code signal. The wordline voltage generator generates a wordline voltage corresponding to the activated one of the wordline voltages. Finally, the wordline voltage is provided to the semiconductor memory device via a pad depending upon the external instruction signal.

BRIEF DESCRIPTION OF THE DRAWINGS

FIG. 4 is a table of logic states of signals shown in FIGS. 3A–3B in normal and test operation modes.

DESCRIPTION OF THE PREFERRED EMBODIMENT

Figure 1:
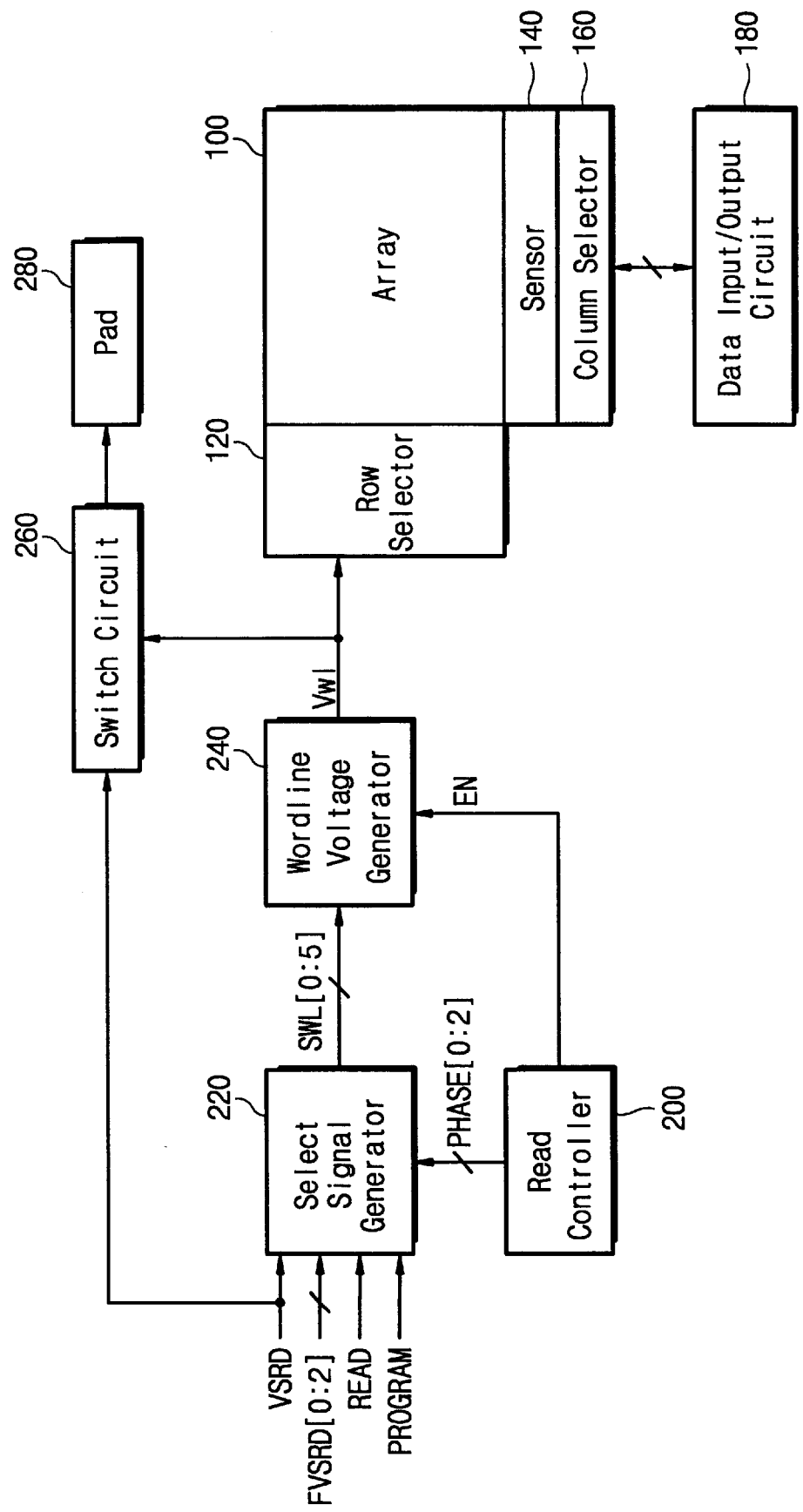
FIG. 1 is a block diagram of a semiconductor memory device in accordance with the present invention.

With reference to FIG. 1, a semiconductor memory device includes a memory cell array 10C having memory cells (not shown) that are arranged in a matrix of rows (wordlines) and columns (bitlines). Each of the memory cells has one of four threshold voltages. Each threshold voltage represents multi-bit data information, for example, "00", "01", "10" and "11". The memory device further includes a row selector 120, a sensor 140, a column selector 160, and a data input/output circuit 180. The circuits 120–180 are well known to a person skilled in the art and will not be explained in further detail.

The electrically erasable and programmable memory device of the present invention includes a read controller 200, a select signal generator 220, a wordline voltage generator 240, a switch circuit 260, and a pad 280.

The controller 200 generates an operation interval enable signal EN that is activated during each operation interval of a read, a program, and a test operation mode. In the read and verify operation modes, the read controller 200 sequentially generates interval signals PHASE [i](i=0, 1, 2) each representing sense intervals of the respective operations.

During the test operation mode, the memory device determines whether a voltage applied to a wordline has a required (or target) level. At this time, the select signal generator 220 outputs wordline voltage select signals SWL [0]–SWL[5] responsive to an external instruction signal VSRD and external select code signals FVSRD[i]. The select signal generator 220 activates one of the wordline voltage select signals SWL[0]–SWL[5] while the others remain inactive.

During the read or program verify operation mode, the select signal generator 220 outputs the wordline voltage select signals SWL[0]–SWL[5] responsive to interval signals PHASE[0]–PHASE[2]. The interval signals PHASE[0] –PHASE[2] are generated by the read controller 200. The select signal generator 220 activates one of the wordline voltage select signals SWL[0]–SWL[5] while the others remain inactive.

The wordline voltage generator 240 operates responsive to the operation interval enable signal EN. The wordline voltage generator generates a wordline voltage Vw1 corresponding to the activated one of the select signals SWL[0] –SWL[5]. The wordline voltage Vw1 is supplied to a selected wordline via the row selector 120.

The switch circuit 260 is coupled to the pad 280. The switch circuit 260 transfers the voltage Vw1 to the pad 280 responsive to the external instruction signal VSRD or during the test operation mode. In one embodiment, the pad 280 is electrically connected to one of the external pins in the memory device, e.g. nSE pin (not shown). The external memory pin might for example be a spare area enable pin for controlling the spare area selection of the memory device.

The wordline voltage generated from the wordline voltage generator 240 is thus transferred to an external pin via the switch circuit 260 and the pad 280 during the test operation mode. As a result, the wordline voltage can be measured externally.

Figure 2:
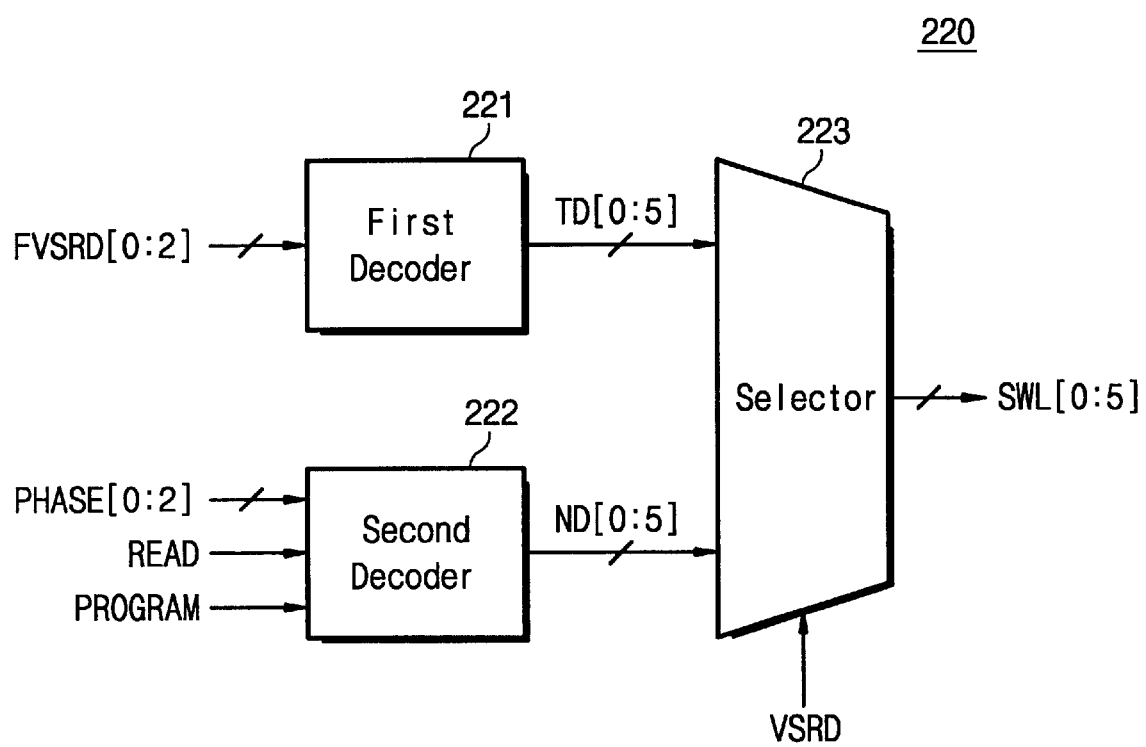
FIG. 2 is a block diagram of a preferred embodiment of the select signal generator shown in FIG. 1.

Referring now to FIG. 2, an embodiment of the select signal generator 220 including a first decoder 221, a second decoder 222, and a selector 223. The first decoder 221 decodes externally applied external select code signals FVSRD[0]–FVSRD[5] and generates therefrom decoding signals TD[0]–TD[5]. One of the decoding signals TD[0] –TD[5] is active while the others are inactive. The second decoder 222 decodes interval signals PHASE[0]PHASE[2] and generates therefrom decoding signals ND[0]–ND[5]. One of the decoding signals ND[0]–ND[5] is active while the others are inactive. The selector 223 provides output signals TD[0]–TD[5] of the first decoder 221 as select signals SWL[0]–SWL[5] responsive to an active external instruction signal VSRD. The selector 223 provides output signals ND[0]–ND[5] of the second decoder 222 as the select signals SWL[0]–SWL[5] responsive to an inactive external instruction signal VSRD.

Figures 3, 3A:
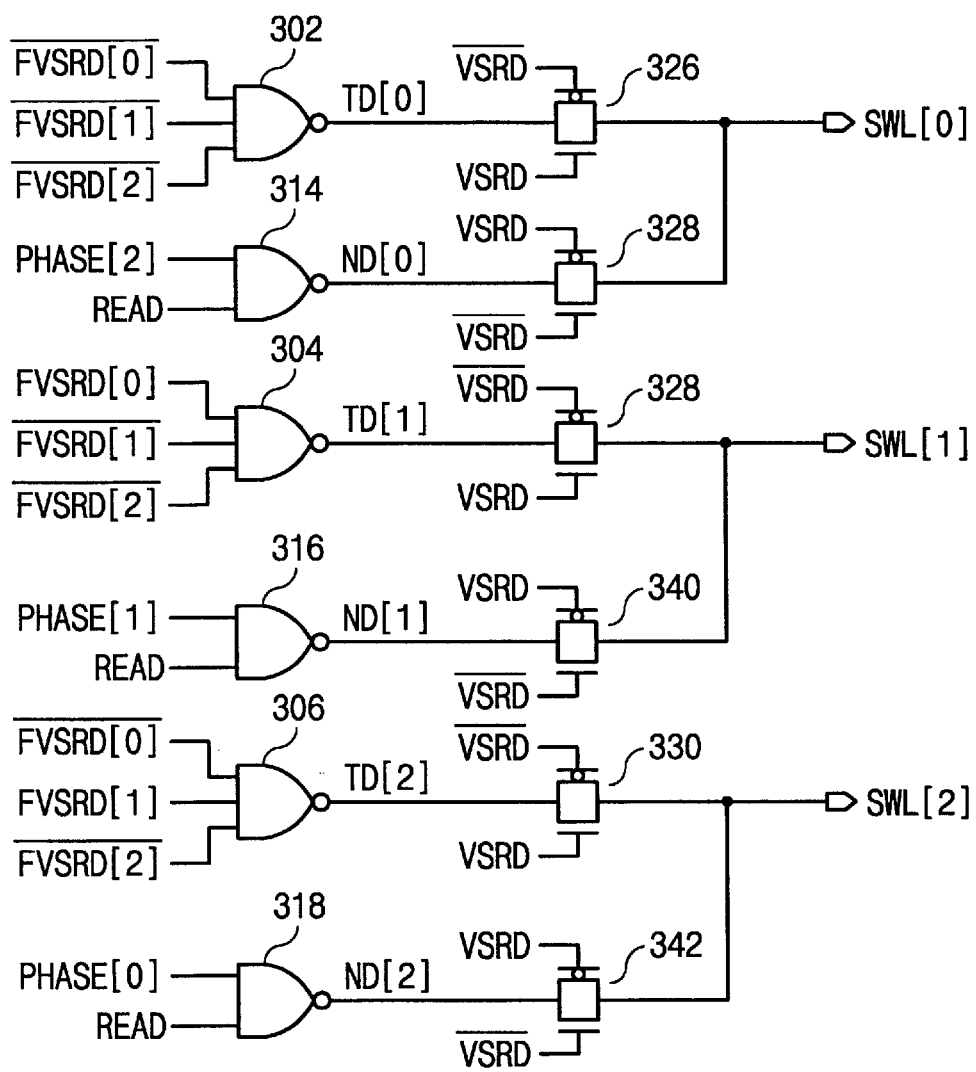
FIG. 3A–3B are a schematic diagrams of the select signal generator shown in FIG. 2.
Figure 3B:
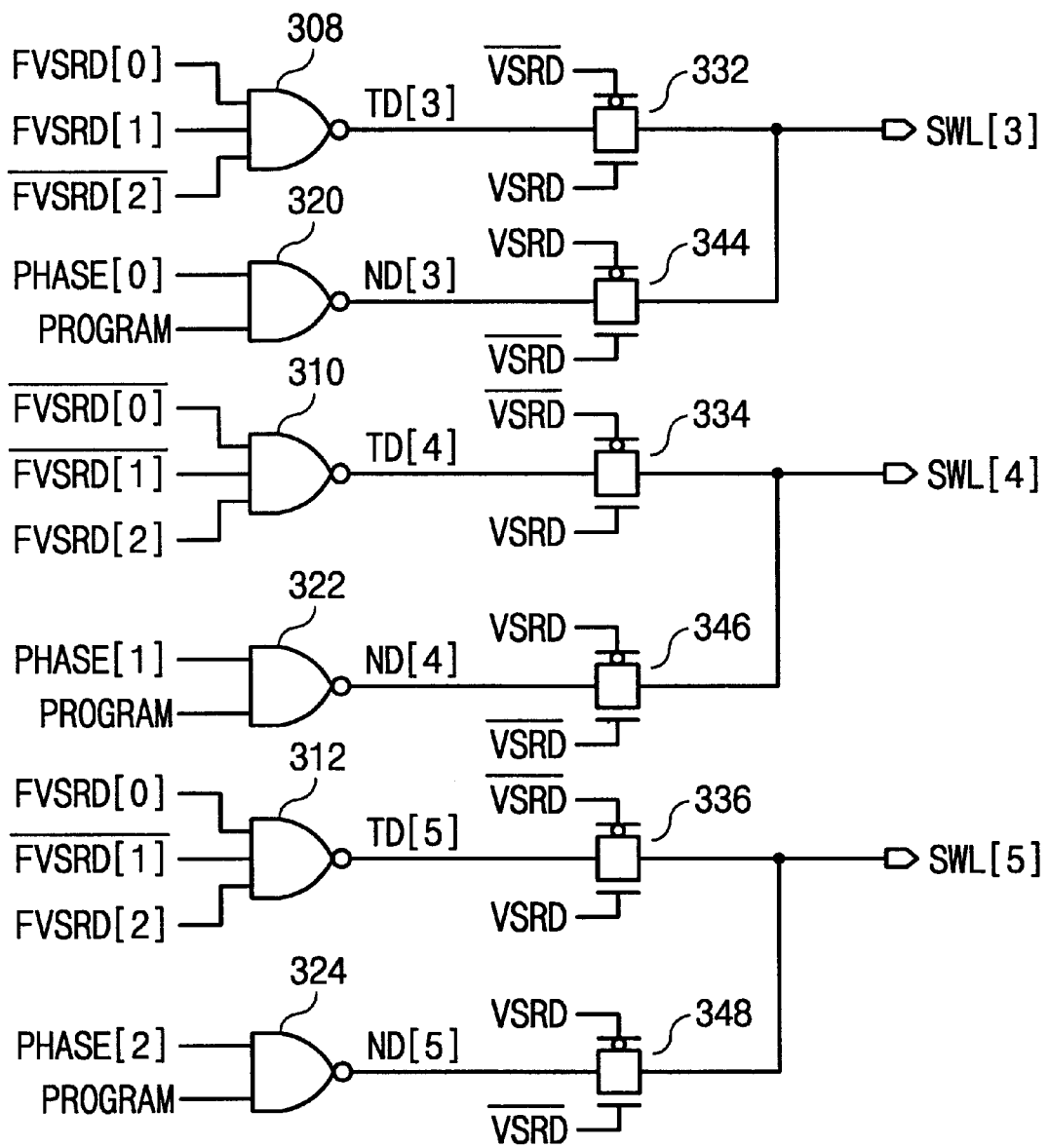

As shown in FIGS. 3A–3B, an embodiment of the first decoder 221 includes six 3-input NAND gates 302–312. An embodiment of the second decoder 222 includes six 2-input NAND gates 314–324. The selector 230 shown in FIG. 2 includes transfer gates 326–348 each corresponding to the NAND gates 302–324. A signal READ is to inform a read operation mode, and a signal PROGRAM is to inform a program verify operation mode.

When the external instruction signal VSRD is active or in a test operation mode, paths through the transfer gates 326-336 are created while those of the transfer gates 338–348 are cut off. In other words, the output signals TD[0]–TD[5] of the first decoder 221 are outputted as the wordline select signals SWL[0]–SWL[5].

Referring to FIG. 4, if external select codes FVSRD[0] –FVSRD[2] of "000" are inputted, an output signal TD[0] of a NAND gate 302 is activated to select a select signal SWL[0]. When the signal VSRD is inactive or in a read operation mode (or verify operation mode), paths through transfer gates 326–336 are cut off while those of transfer gates 338–348 are created. In other words, output signals ND[0]–ND[5] of the second decoder 221 are outputted as wordline select signals SWL[0]–SWL[5]. When an interval signal PHASE[0] representing a first sense interval of a read operation mode is active, an output signal ND[2] of a NAND gate 318 is also active. Thus, a wordline select signal SWL[2] is active via the transfer gate 342.

In this embodiment, select signals SWL[0]–SWL[2] correspond to voltages Vread1, Vread2, and Vread3 applied to a selected wordline in a read operation mode, respectively. Therefore if a nonvolatile semiconductor memory device enters a test operation mode, different-level wordline voltages Vread1, Vread2, Vread3, Vvfy1, Vvfy2, and Vvfy3 used in the read and verify operation modes can separately be selected with corresponding combinations of external select code signals FVSRD[0]–FVSRD[2].

Figure 5:
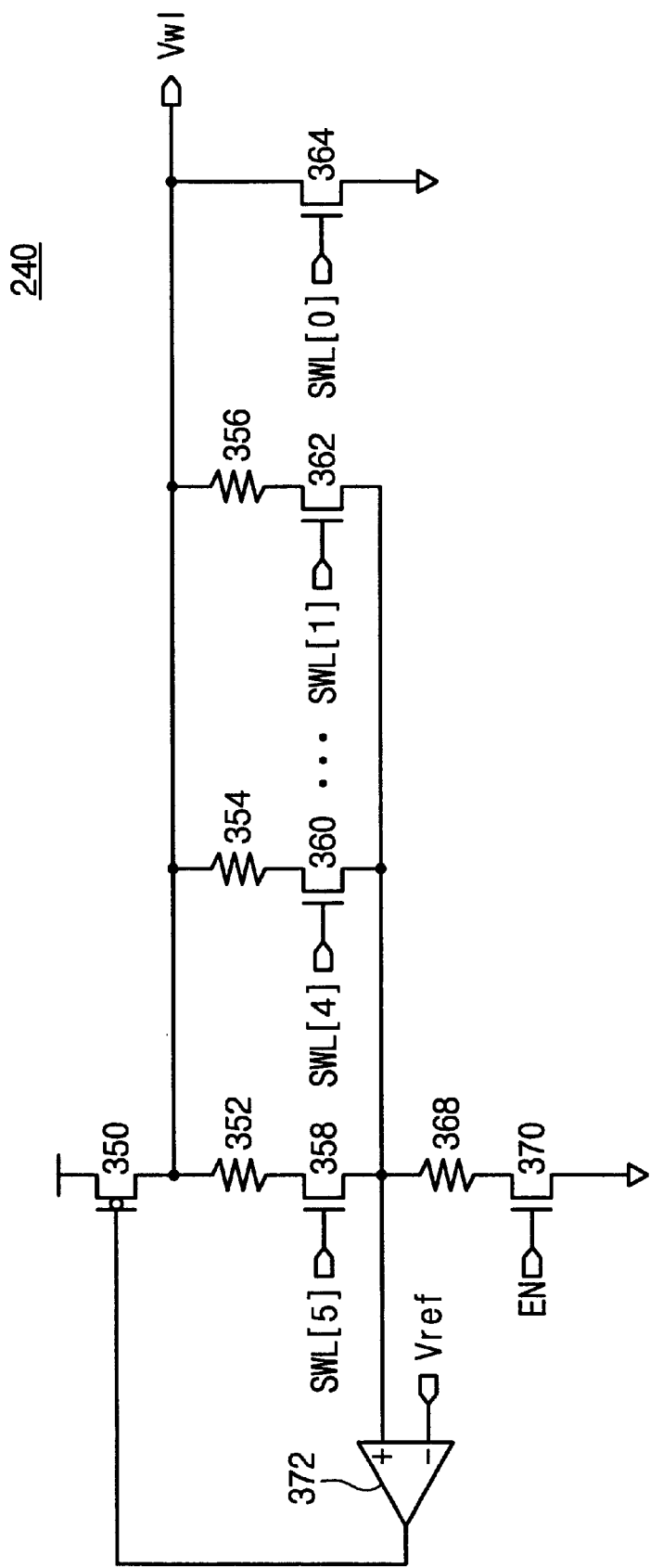
FIG. 5 is a schematic diagram showing a preferred embodiment of the wordline voltage generator shown in FIG. 1.

Referring to FIG. 5, an embodiment of the wordline voltage generator 240 includes a PMOS transistor 350, resistors 352, 354–356, and 368, NMOS transistors 358, 360–363, 364, and 370, and a comparator 372. The NMOS transistor turns on responsive to the interval enable signal EN. When the NMOS transistor 362 corresponding to an activated wordline select signal (e.g., SWL[1]) is turned on, the comparator 372 compares a voltage distributed by the resistors 356 and 368 corresponding to the turned-on NMOS transistor 362 with a reference voltage Vref. If the distributed voltage is lower than the reference voltage Vref, a current is supplied to an output terminal via the PMOS transistor 350 so that a voltage Vw1 of the output terminal may reach a wordline voltage Vread2 corresponding to the activated select signal SWL[1]. If the distributed voltage is identical to or higher than the reference voltage Vref, the PMOS transistor is turned off to retain the voltage of the output terminal Vw1 at the required wordline voltage Vread2.

Figure 6:
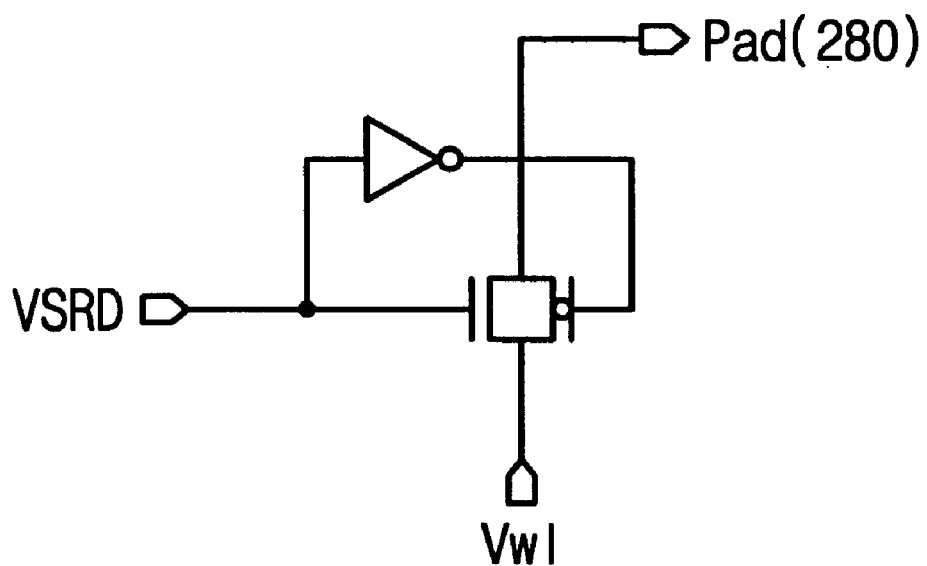
FIG. 6 is a schematic diagram showing a preferred embodiment of the switch circuit shown in FIG. 1.

As shown in FIG. 6, a switch circuit 260 is implemented using a transfer gate (including PMOS and NMOS transistors and an inverter) that is well known in the art. When an external instruction signal VSRD representing a test operation mode is low level or in read or program operation mode, an output Vw1 of a wordline voltage generator 240 is electrically isolated from a pad 280 that is coupled to an external pin (not shown). When the signal VSRD is high level or in a test operation mode, the output Vw1 is transferred to the pad 280. As a result, the wordline voltage Vw1 transferred via the switch circuit 260 is measured in the exterior.

Figure 7:
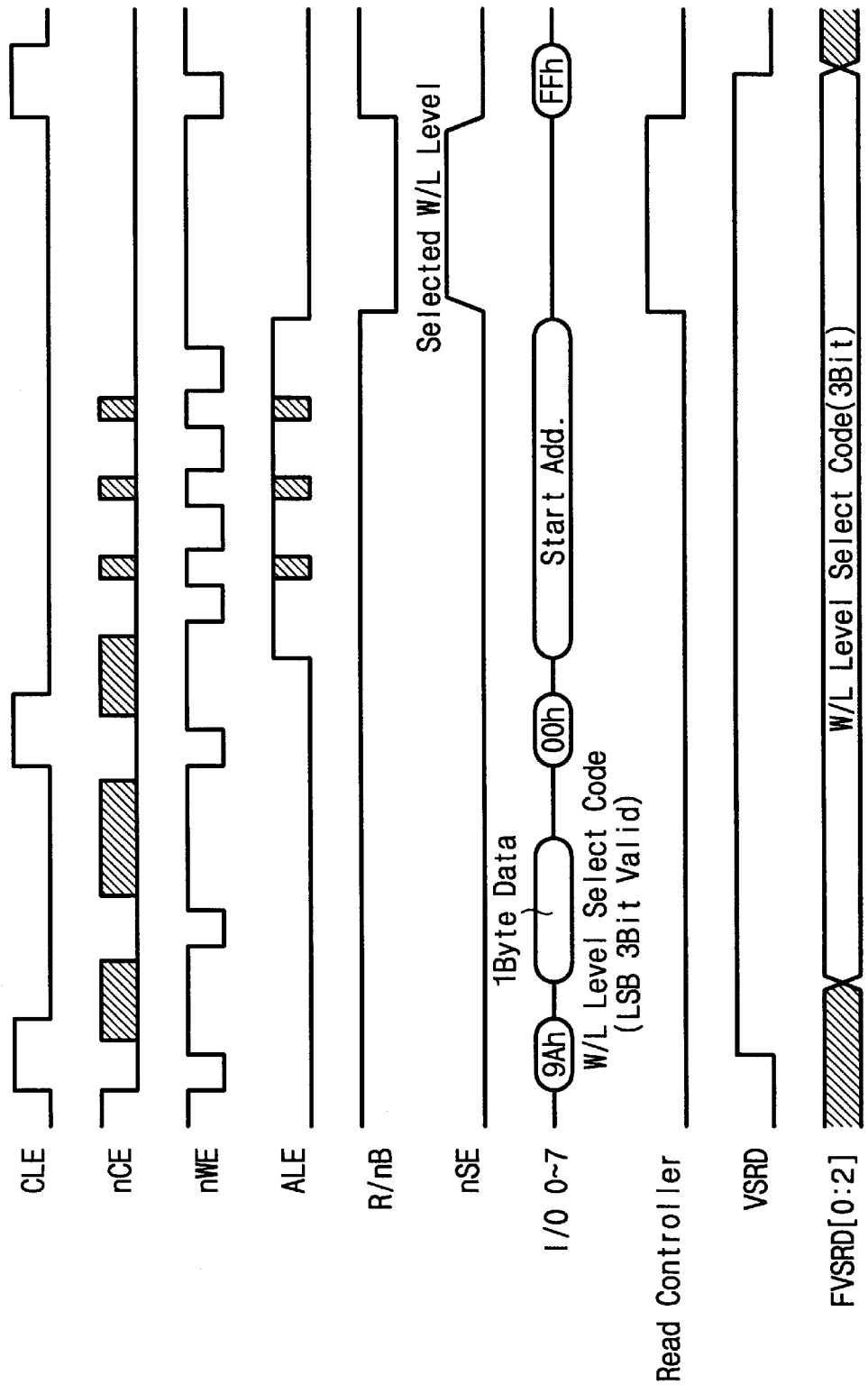
FIG. 7 is a timing diagram associated with a wordline measure operation in accordance with the present invention.
Figure 8:
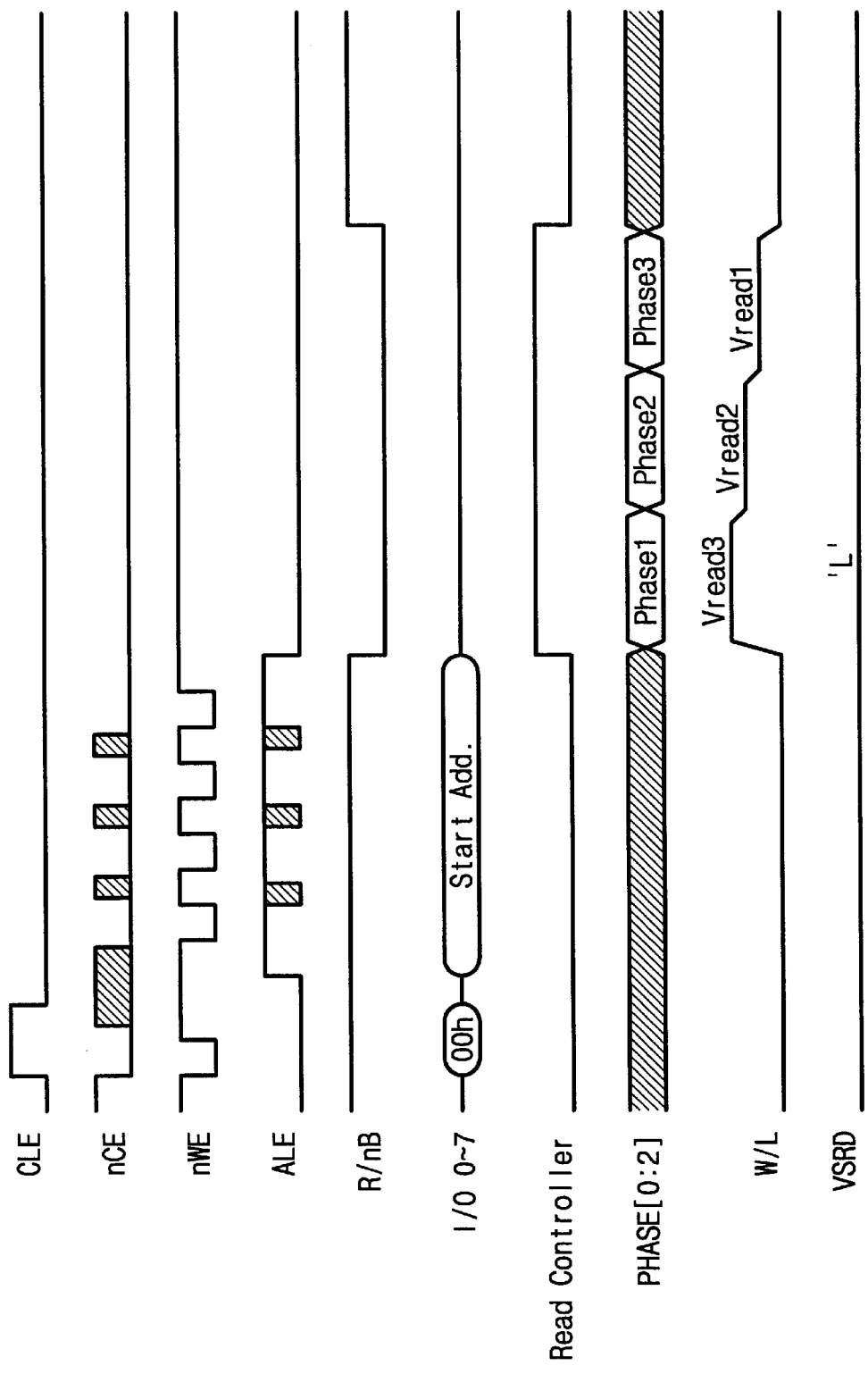
FIG. 8 is a timing diagram associated with a read operation in accordance with the present invention.

The operation of a nonvolatile semiconductor memory device according to the invention will now be described more fully with reference to FIGS. 7 and 8.

An external instruction (e.g., 9Ah) representing a test operation mode is synchronized with an nWE signal, being provided to a nonvolatile semiconductor memory device via input/output pins I/O0–I/O7. Accordingly, an external instruction signal VSRD transitions from low level to high level. This implies that outputs TD[0]–TD[5] of a first decoder 221 in a select signal generator 220 are outputted as select signals SWL[0]–SWL[5]. Then, 1-byte data of an external select code for selecting one of wordline voltages is applied via the input/output pins I/O0–I/O7. In this case, only three lower bits out of the external select code are useful. For example, if lower bits out of the external select code are "001" (or external select code signals FVSRD[0]–FVSRD[2] are "001"), an output TD[4] of a NAND gate 310 in the first decoder 221 is active, as shown in FIG. 4. Consequently, the wordline select signal SWL[4] is active while other select signals SWL[0]–SWL[3] and SWL[5] are inactive.

And then, as a read instruction (e.g., 00h) and a start address are sequentially inputted, a read operation for a test operation mode will be carried out. A read controller 200 activates an operation interval enable signal EN representing an operation interval of the test operation mode. This leads to creation of a wordline voltage Vvfy2 corresponding to the activated wordline select signal SWL[4]. The created wordline voltage Vvfy2 is provided to a row selector 120 and transferred to a pad 280 via a switch circuit 260. It is therefore possible to measure whether a wordline voltage Vvfy2 has a required level via the external pin coupled to the pad 280. An FFh instruction is applied via the input/output pins I/O1–I/O7, finishing the test operation mode.

The above-described procedure is repeatedly carried out to easily measure via an external pin whether each of various voltages applied to a wordline has required level. This implies that although a memory device is packed, a wordline voltage can be measured via the external pin.

Figure 9:
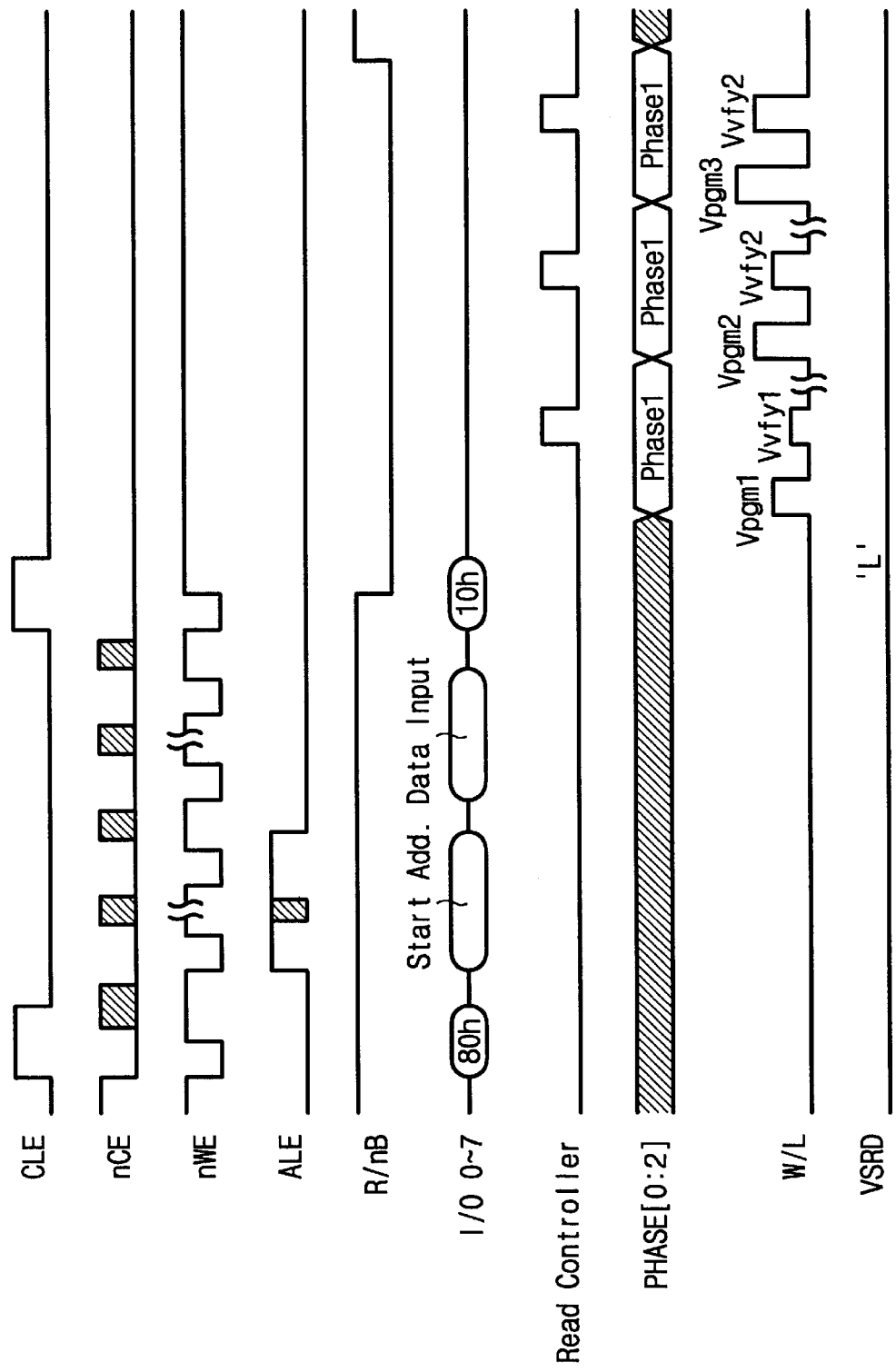
FIG. 9 is a timing diagram associated with a program operation in accordance with the present invention.
Figure 10:
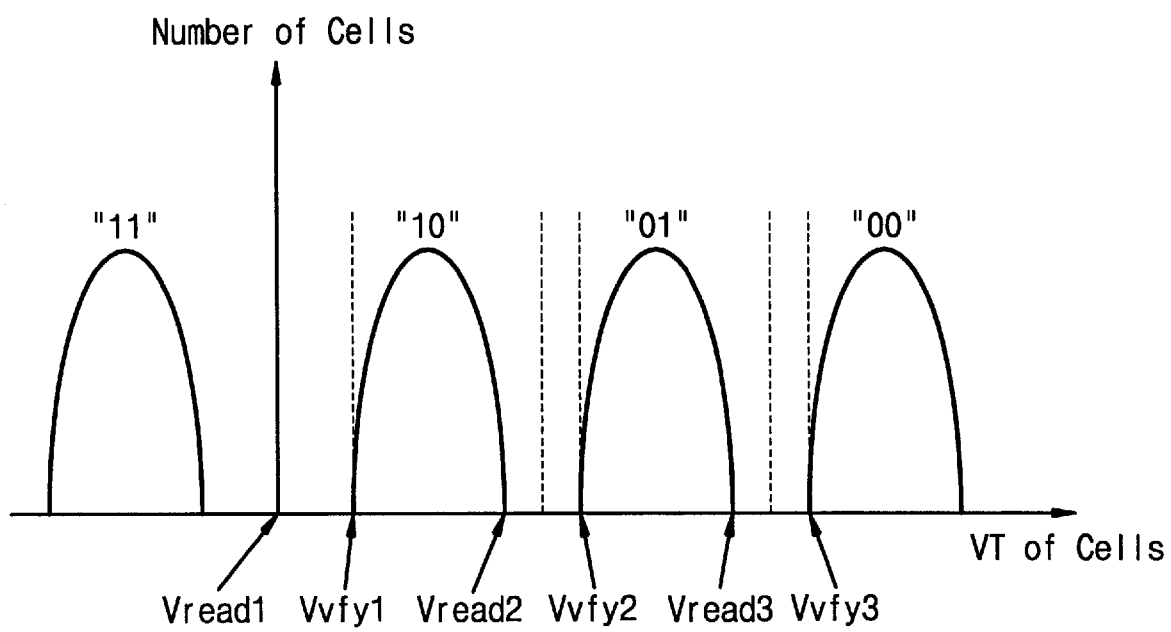
FIG. 10 is a graph of a distribution of a threshold voltage in a conventional memory cell for string 2-bit data.

As shown in FIG. 9 and FIG. 10, since an external instruction signal VSRD representing a test operation mode retains low level, output signals ND[0]–ND[5] of a second decoder 222 in a select signal generator 220 may be outputted as wordline select signals SWL[0]–SWL[5]. In a read operation mode, select signals SWL[0]–SWL[2] may sequentially be provided to a wordline where different-level read voltages Vread3, Vread2, and Vread1 are selected via a row decoder circuit 120 with sequential activation of interval signals PHASE[0]–PHASE[2]. Similarly, in a program operation mode, select signals SWL[3]–SWL[5] may be sequentially be provided to a wordline where the verify voltages Vvfy1, Vvfy2, and Vvfy3 are selected via the row decoder circuit 120 with sequential activation of the interval signals PHASE[0]–PHASE[2].

Measuring a wordline voltage is supported as an instruction type, easily measuring whether a wordline voltage has required level via an external pin.

In the drawings and specification, there have been disclosed typical preferred embodiments of the invention and, although specific terms are employed, they are used in a generic and descriptive sense only and not for purpose of limitation, the scope of the invention being set forth in the following claims.

What is claimed is:

1. A semiconductor memory device comprising:
    a memory cell array having a plurality of wordlines, a plurality of bitlines, and a plurality of memory cells located at intersections of the wordlines and the bitlines;
    a row selector, coupled to the wordlines, adapted to select one of the wordlines and to supply a wordline voltage to the selected wordline;
    a select signal generator adapted to generate a plurality of wordline select signals responsive to an external instruction signal and a plurality of external select codes, the select signal generator being adapted to activate one of the wordline select signals responsive to the external instruction signal indicating a test mode;
    a voltage generator adapted to generate a wordline voltage corresponding to the activated select signal; and
    a switch circuit adapted to provide the wordline voltage to a pad responsive to the external instruction signal.

2. The device of claim 1 wherein each of the plurality of memory cells is adapted to store multi-bit data and operates with a plurality of threshold voltages.

3. The device of claim 2 comprising a controller adapted to generate an interval enable signal representative of operation intervals of the test, read, and verify modes, wherein the voltage generator is adapted to operate responsive to the interval enable signal.

4. The device of claim 3 wherein the controller is adapted to sequentially generate interval enable signals indicative of sense intervals for the read and verify modes.

5. The device of claim 4 wherein the select signal generator is adapted to sequentially activate the plurality of wordline select signals responsive to corresponding to the sequential interval enable signals, each select signal corresponding to a respective sense interval of the read and verify modes.

6. The device of claim 5 wherein the voltage generator is adapted to generate a wordline voltage responsive to one of the activated wordline select signals in the read and verify modes.

7. The device of claim 1 wherein each of the plurality of memory cells includes an electrically erasable and programmable read only memory.

8. The device of claim 1 wherein the pad is coupled to one of the external pins of the semiconductor memory device.

9. A nonvolatile semiconductor memory device, comprising:

at least one electrically erasable and programmable memory cell adapted to store multi-bit data responsive to a plurality of threshold voltages;

at least one wordline connected to the at least one cell;

a first select signal generator adapted to activate one of a plurality of wordline select signals in a test mode responsive to a plurality of external select code signals;

a voltage generator adapted to generate a wordline voltage corresponding to the active wordline select signal, the wordline voltage being applied to the at least one wordline when multi-bit data is read out from the at least one memory cell; and a switch circuit coupled to the semiconductor memory device and adapted to transfer the wordline voltage to a pad during the test mode.

10. The device of claim 9 wherein if the semiconductor memory device is packed, the pad is coupled to one of a plurality of external pins of the packed memory device.

11. The device of claim 9 comprising a controller adapted to generate an interval enable signal representing operation intervals of the test mode and the read and verify modes and adapted to generate sequential interval signals indicative of sense intervals of the read and verify modes, the voltage generator operating responsive to the interval enable signal.

12. The device of claim 11 comprising:

a second select signal generator adapted to sequentially activate select signals corresponding to the respective sense intervals of the read and verify modes responsive to the sequential interval signals; and a selector adapted to transfer to the voltage generator either the sequentially activated select signals or the wordline select signals responsive to an external instruction signal.

13. A method of measuring wordline voltages in a semiconductor memory device comprising a memory cell array having a plurality of wordlines, a plurality of bitlines, and a plurality of memory cells located at intersections of the wordlines and the bitlines, a row selector adapted to select one of the wordlines and supply a wordline voltage to the selected wordline, and a wordline voltage generator adapted to generate other wordline voltages, the method comprising:

receiving an external instruction signal indicative of a test mode;

receiving an external select code signal corresponding to one of the other wordline voltages;

activating one of a plurality of select signals corresponding to the other wordline voltages responsive to the external select code signal during the test mode;

generating a wordline voltage corresponding to the activated select signal; and providing the wordline voltage to a pad responsive to the external instruction signal.

14. The method of claim 13 including electrically connecting the pad to a packed memory device.

15. The method of claim 13 including providing an electrically erasable and programmable memory cell for storing multi-bit data information for each of the plurality of memory cells.

16. The method of claim 13 comprising:

generating an interval enable signal representing operation intervals of a read and verify modes and the test mode; and generating sequential interval signals for appointing sense intervals of the read and verify modes;

wherein generating the wordline voltage is responsive to the interval enable signal.

17. The method of claim 15 comprising:

sequentially activating select signals each corresponding to respective sense intervals of the read and verify modes responsive to the sequentially generated interval signals;

selecting between select signals generated in the test mode or in the read and verify modes; and transferring the selected select signals to the wordline voltage generator.

\* \* \* \* \*

UNITED STATES PATENT AND TRADEMARK OFFICE
CERTIFICATE OF CORRECTION

PATENT NO. : 6,473,344 B2  Page 1 of 1
DATED : October 29, 2002
INVENTOR(S) : Kim et al.

It is certified that error appears in the above-identified patent and that said Letters Patent is hereby corrected as shown below:

<u>Title page,</u>
Item [57], ABSTRACT,
Line 3, "determine" should read -- determines --.

<u>Column 3,</u>
Line 15, "FIG. 3A-3B" should read -- FIGS. 3A-3B --.
Line 19, "diagram showing a" should read -- diagram of a --.
Line 32, "string" should read -- storing --.
Line 37, "10C" should read -- 100 --.
Line 50, "The controller" should read -- The read controller --.

<u>Column 4,</u>
Line 34, "PHASE[0]PHASE[2]" should read -- PHASE[0]-PHASE[2] --.

<u>Column 7,</u>
Line 18, "of the external pins" should read -- of external pins --.

Signed and Sealed this

Twenty-first Day of October, 2003

JAMES E. ROGAN
*Director of the United States Patent and Trademark Office*